(12) United States Patent
Yamada et al.

(10) Patent No.: US 8,981,401 B2
(45) Date of Patent: Mar. 17, 2015

(54) PACKAGE FOR OPTICAL SEMICONDUCTOR DEVICE, OPTICAL SEMICONDUCTOR DEVICE USING THE PACKAGE, AND METHODS FOR PRODUCING SAME

(75) Inventors: Tomoyuki Yamada, Kyoto (JP); Tomohiro Futagami, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 316 days.

(21) Appl. No.: 12/933,064

(22) PCT Filed: Sep. 30, 2009

(86) PCT No.: PCT/JP2009/005034
§ 371 (c)(1),
(2), (4) Date: Sep. 16, 2010

(87) PCT Pub. No.: WO2010/038451
PCT Pub. Date: Apr. 8, 2010

(65) Prior Publication Data
US 2011/0012159 A1 Jan. 20, 2011

(30) Foreign Application Priority Data
Sep. 30, 2008 (JP) .................... 2008-253885

(51) Int. Cl.
*H01L 33/00* (2010.01)
*H01L 33/60* (2010.01)

(52) U.S. Cl.
CPC .......... *H01L 33/60* (2013.01); *H01L 2924/0002* (2013.01); *H01L 2224/48091* (2013.01)
USPC ............... 257/98; 257/79; 257/666; 257/677; 257/762; 257/E33.066; 257/E33.072; 438/26

(58) Field of Classification Search
USPC ...................... 257/79, 98, E33.001, E33.055, 257/E33.056, E33.066, E33.072, 666, 677, 257/741, 750, 762; 438/22, 26
See application file for complete search history.

(56) References Cited

U.S. PATENT DOCUMENTS 5,510,197 A * 4/1996 Takahashi et al. ............ 428/670
5,767,574 A 6/1998 Kim et al.
(Continued)

FOREIGN PATENT DOCUMENTS

CN 1825580 A 8/2006
CN 101159302 A 4/2008
(Continued)

OTHER PUBLICATIONS

Masaru Sugimoto et al., "High-Output White LED Light Source," Published in Matsushita Denko Giho (Matsushita Electric Works Technical Report) vol. 53, No. 1, pp. 4-9, with Partial English Translation.
(Continued)

*Primary Examiner* — Kenneth Parker
*Assistant Examiner* — John Lin
(74) *Attorney, Agent, or Firm* — McDermott Will & Emery LLP

(57) ABSTRACT

The present invention is a package for optical semiconductor devices, and an optical semiconductor device using the package, which can prevent discoloration of a plating layer formed on a lead frame even when a silicone resin is used as a sealing resin for an optical semiconductor device, and which enables high luminous efficiency for a long time.
Specifically, in the package for semiconductor devices, a plating laminate 15, wherein a pure Ag plating layer 4, a thin reflective plating layer 6 serving as the uppermost layer for improving the light reflection ratio, and a resistant plating layer 5 serving as an intermediate layer therebetween and having chemical resistance against at least either metal chlorides or metal sulfides are laminated, is formed on at least the surface of a lead electrode. The reflective plating layer 4 is composed of a pure Ag thin film, and the resistant plating layer 5 is composed of a complete solid solution Au—Ag alloy plating layer.

12 Claims, 5 Drawing Sheets

(56) References Cited

U.S. PATENT DOCUMENTS

| | | | |
|---|---|---|---|
| 6,451,402 B1 * | 9/2002 | Nee | 428/64.1 |
| 2006/0186553 A1 | 8/2006 | Ohta et al. | |
| 2008/0083973 A1 * | 4/2008 | Yamada et al. | 257/676 |
| 2009/0152729 A1 | 6/2009 | Ohta et al. | |
| 2012/0074551 A1 | 3/2012 | Ohta et al. | |

FOREIGN PATENT DOCUMENTS

| | | |
|---|---|---|
| JP | 9-266280 | 10/1997 |
| JP | 2006-066504 | 3/2006 |
| JP | 2006-273810 | 10/2006 |
| JP | 2006-303069 | 11/2006 |
| JP | 2008-010591 | 1/2008 |
| JP | 2008-053564 | 3/2008 |
| JP | 2008-091818 | 4/2008 |
| JP | 2008-192635 | 8/2008 |

OTHER PUBLICATIONS

Chinese Office Action, and English translation thereof, issued in Chinese Patent Application No. 200980111889.8 dated Jul. 4, 2012.

* cited by examiner

Degree of reflection of 350-800 nm emission wavelengths
(degree of reflection after sulfidation test)

Degree of reflection of 450 nm emission wavelength
(degree of reflection after sulfidation test)

PACKAGE FOR OPTICAL SEMICONDUCTOR DEVICE, OPTICAL SEMICONDUCTOR DEVICE USING THE PACKAGE, AND METHODS FOR PRODUCING SAME

RELATED APPLICATIONS

This application is the U.S. National Phase under 35 U.S.C. §371 of International Application No. PCT/JP2009/005034, filed on Sep. 30, 2009, which in turn claims the benefit of Japanese Application No. 2008-253885, filed on Sep. 30, 2008, the disclosures of which Applications are incorporated by reference herein.

TECHNICAL FIELD

The present invention relates to a lead frame for an optical semiconductor device and in particular to technology for preventing a decrease in luminous efficiency of an optical semiconductor device on which is mounted a light emitting element that emits light of a short wavelength (400-500 nm).

BACKGROUND ART

Optical semiconductor devices that use LEDs or the like as a light source have conventionally been in wide use as a light source for a variety of forms of display, illumination, and backlighting.

Recently, conventional structures of optical semiconductor devices include: (i) a structure generated by providing a lead frame on for example, a substrate, and then mounting a light emitting element on the lead frame, subsequently sealing the light source and its surrounding area with a sealing resin to prevent deterioration of the light source and its surrounding area due to heat, humidity, oxidation, etc.; (ii) a structure generated by mounting a light emitting element on a ceramic compact having metal wiring in a concavity, subsequently sealing the light source and its surrounding area with a sealing resin to prevent deterioration of the light source and its surrounding area due to heat, humidity, oxidation, etc.; and (iii) a structure generated by mounting a light emitting element on a hermetically sealed component composed of a metal base, lead wire, and sealing glass, and subsequently sealing the light source and its surrounding area with a sealing resin to prevent deterioration of the light source and its surrounding area due to heat, humidity, oxidation, etc.

The material for the sealing resin is required to be extremely transparent and to be able to maintain high brightness of the light source.

In recent years, optical semiconductor devices developed for uses such as illumination include white-light emitting devices that emit white light as a combination of three colors of light, or that use a blue or violet-blue light emitting element and are sealed with sealing resin that includes fluorescent material. There is an increasing need for devices that emit white light and have high output, and the demand has grown for devices that emit light at short wavelengths and that are endowed with transparency and resistance to deterioration.

In all cases, silicone resin that has superior retention properties in the areas of heat resistance and transparency as compared to epoxy resin is used as the sealing resin (for example, see Non-Patent Literature 1).

In order to obtain superior light source characteristics, it is important to increase luminous efficiency of the light source while also efficiently using light emitted from the light source. Accordingly, technology exists to cover the lead frame placed around the light source in the optical semiconductor device with a plating layer having a superb degree of reflection. Ag, a metal that has a high degree of reflection over a broad range of emission wavelengths, is widely used as the material for plating.

At present, a variety of ideas have thus been conceived to endow an optical semiconductor device with superb performance in terms of white-light emission or high emission.

In this context, optical semiconductor devices have the following problems. Upon driving an optical semiconductor device and performing an accelerated reliability test, the inventors observed that the surface of an Ag plating layer surrounding where the light emitting element is mounted and sealed with silicone resin became discolored, turning a blackish brown color. Consideration of this phenomenon revealed that, when using silicone resin that includes a resin hardening catalyst, such as metal sulfides or metal chlorides, of which platinic chloride is representative, the change in color was caused by a reaction between the catalyst and the Ag plating layer that produced $Ag_2S$ (silver sulfide), AgCl (silver chloride), or another silver halide.

The inventors also observed that the near-ultraviolet radiation produced by the light emitting element when driven accelerated the reaction producing a silver halide (silver sulfide, silver chloride, etc.); in particular, this reaction became pronounced due to blue and violet-blue light in the near-ultraviolet region. The platinic chloride or other catalyst included in the silicone resin is extremely reactive with the Ag plating layer that is in contact with the catalyst, and at the boundary surface between the silicone resin and the Ag plating layer, the Ag plating layer easily ionizes. Accordingly, the catalyst has the effect of increasing reaction to a silver halide such as silver sulfide or silver chloride. Furthermore, since silicone resin is extremely gas-permeable, it is easy for halogen gas or sulfur gas ($SO_x$ gas such as $SO_2$) to penetrate from outside the sealing resin to the Ag plating layer. Therefore, after manufacturing, there is a risk that externally produced halogen gas or sulfur gas will come into contact with the surface of the Ag plating, triggering a reaction to produce an unwanted silver compound such as silver sulfide or silver chloride.

If the surface of the Ag plating layer near the pad on which the light emitting element is mounted turns a blackish brown color, the plating layer loses the high degree of reflection that normally characterizes Ag, and thus the degree of reflection drops conspicuously. This may cause the light yielded by the optical semiconductor device to become insufficient.

To overcome the problem of the Ag plating layer turning a blackish brown color, the inventors produced an invention with a plating laminate composed of a pure Ag plating layer and an Au—Ag alloy plating layer (Patent Literature 2). In this plating laminate, the Au—Ag alloy plating in the uppermost layer has the effect of controlling the change to a blackish brown color, while also improving the degree of reflection of light and promising an improvement in constant light source characteristics.

CITATION LIST

Patent Literature

[Patent Literature 1] Japanese Patent Application Publication No. H9-266280
[Patent Literature 2] Japanese Patent Application Publication No. 2008-91818

Non-Patent Literature

[Non-Patent Literature 1] Matsushita Electric Works Technical Report, Vol. 53, No. 1

SUMMARY OF INVENTION

Technical Problem

In the above conventional technology, however, the degree of reflection of light in part of the wavelength range can decrease about 10% as compared to a structure that uses a pure Ag plating layer as the uppermost layer. Specifically, when using a pure Ag plating layer, the degree of reflection in the 450 nm wavelength range is approximately 90%. By comparison, when using a plating laminate that has an Au—Ag alloy plating as the uppermost layer, the degree of reflection in the same wavelength range is only approximately 80%.

Therefore, there is an increasing demand for a package for an optical semiconductor device, and an optical semiconductor device using this package, that can prevent the Ag plating layer from turning a blackish brown color and that promise a degree of reflection and emission of light at least as high as a conventional Ag plating layer.

The present invention has been conceived in light of the above problems and overcomes part of the drawbacks of the laminate with a pure Ag plating layer and an Au—Ag alloy plating layer, as the inventors formerly proposed.

Concretely, it is an object of the present invention to provide a package for an optical semiconductor device, and an optical semiconductor device using the package, in which, near where a light emitting element is mounted, the degree of reflection of the light-reflecting surface of a plating layer disposed on the package for an optical semiconductor device does not decrease conspicuously as compared to an Ag plating layer, even when silicone resin is used as a sealing resin for an optical semiconductor device, and which, during a reliability test or during actual use, demonstrate both extreme effectiveness in preventing the plating layer disposed on a lead frame of the optical semiconductor device from turning a blackish brown color as well as high luminous efficiency for a long time.

Solution to Problem

To solve the above problems, the present invention is a package for an optical semiconductor device including an enclosure, lead electrode, and terminal electrode, and in which a plating laminate composed of a plurality of plating layers is formed on at least part of a surface of the lead electrode, wherein the plating laminate includes: a pure Ag plating layer, an uppermost layer that is a thin film reflective plating layer thinner than the pure Ag plating layer, and an intermediate layer, between the pure Ag plating layer and the uppermost layer, that is a resistant plating layer composed of a complete solid solution Au—Ag alloy plating layer, the resistant plating layer having chemical resistance to at least one of metal chlorides and metal sulfides.

A structure in which the Au—Ag alloy plating includes Au as a primary component and includes Ag in a range of 27.0 wt % to 50.0 wt % inclusive is desirable.

The resistant plating layer preferably has a thickness between 0.05 μm and 0.3 μm inclusive.

On the other hand, the reflective plating layer is preferably a thin layer of pure Ag. In this case, it is desirable for the reflective plating layer to have a thickness between 0.003 μm and 0.010 μm inclusive.

The pure Ag plating layer preferably has a thickness between 1.6 μm and 8.0 μm inclusive. Also, it is desirable for the pure Ag plating layer to have a degree of brilliance of 1.2 or greater.

Furthermore, the present invention may be a structure in which the plating laminate is provided at, at least, part of a surface of the enclosure that is in contact with sealing resin.

Another aspect of the present invention is an optical semiconductor device comprising a light emitting element, provided in electrical connection with a lead electrode, and sealing resin provided so as to seal the light emitting element and the lead electrode, wherein the lead electrode has a degree of reflection, with respect to emissions by the light emitting element, of 50% or greater at an emission wavelength of 400 nm, 80% or greater at an emission wavelength of 450 nm, and 85% or greater at an emission wavelength range of 500 nm to 700 nm.

Also, the present invention may be an optical semiconductor device comprising a light emitting element, provided in electrical connection with a lead electrode in the above package for an optical semiconductor device, and sealing resin provided so as to seal the light emitting element and the lead electrode, wherein the plating laminate is at least provided at a surface region of the lead electrode to which the light emitting element is electrically connected, and the lead electrode has a degree of reflection, with respect to emissions by the light emitting element, of 50% or greater at an emission wavelength of 400 nm, 80% or greater at an emission wavelength of 450 nm, and 85% or greater at an emission wavelength range of 500 nm to 700 nm.

The sealing resin may be a transparent resin that includes a metal chloride catalyst. In this case, the transparent resin may be exemplified by silicone resin. Also, the metal chloride catalyst may be exemplified by platinic chloride.

The present invention is also a manufacturing method of a package for an optical semiconductor device, during which a plating laminate with a plurality of layers is formed at least on a surface of a lead electrode in the package for an optical semiconductor device, the manufacturing method comprising the steps of: forming the plating laminate by a first plating step to form a pure Ag plating layer, a second plating step to form an Au—Ag alloy plating layer as an intermediate layer of the plating laminate, and a third plating step to form a pure Ag flash plating layer as an uppermost layer; and heating the plating laminate to form a complete solid solution.

The present invention is also a manufacturing method of an optical semiconductor device in which a light emitting element is electrically connected with a lead electrode of a package for the optical semiconductor device, and in which sealing resin seals the light emitting element and the lead electrode by being adhered thereto, wherein within a package for an optical semiconductor device manufactured via the manufacturing method of a package for an optical semiconductor device according to the present invention, a region where the plating laminate is formed is sealed with sealing resin composed of silicone resin.

Advantageous Effects of Invention

In the package for an optical semiconductor device and optical semiconductor device using the package with the above structure in the present invention, a pure Ag plating layer that is formed as a plating laminate on the surface of the package for an optical semiconductor device is always covered by a resistant plating layer composed of an Au—Ag alloy plating layer. Furthermore, the resistant plating layer is covered by an uppermost layer of a thin, pure Ag flash plating layer.

In the present invention, by forming the resistant plating layer, which is the intermediate layer in the plating laminate, for example with an Au—Ag alloy plating layer having an Ag content between 27.0 wt % and 50.0 wt % inclusive, direct contact with S (sulfur), Cl (chlorine), etc. ions that penetrate through the surface of the plating laminate is prevented, and unwanted silver compounds (silver sulfide, silver chloride, etc.), which cause discoloration that results in a blackish brown color, are prevented from occurring.

In particular, it is known that sulfidation wherein Ag reacts with S (sulfur) proceeds in the direction of thickness (depth) of the plating layer, but in the case of the plating laminate in the present invention, since a resistant plating layer is provided as an intermediate layer, penetration of S (sulfur) to the pure Ag plating layer is prevented at a relatively thin depth.

Note that when a thin, pure Ag flash plating layer is formed as the uppermost layer of the plating laminate, the plating layer is considered to react easily with S (sulfur), Cl (chlorine), etc. ions. In the present invention, however, the existence of a resistant plating layer effectively prevents the plating layer from turning a blackish brown color. In other words, by providing the plating laminate with a heat history (thermal history), for example in the range of 300° C.-360° C., the precipitation state of the Au—Ag alloy plating changes from a mixture of gold atoms and silver atoms to a complete solid solution, which is the true nature of a gold-silver alloy. The inventors confirmed that, with this type of alloy structure in the intermediate layer of the plating laminate, the corrosion resistance improves not only in the resistant plating layer but in the entire plating laminate; furthermore, the degree of reflection also improves.

As described above, with the package for an optical semiconductor device and optical semiconductor device using the package according to the present invention, an Ag flash plating layer is provided as the uppermost layer, and a heat history is added to the plating laminate, which greatly improves the corrosion resistance of the plating layers. As a result, in comparison with the invention recited in Patent Literature 2, for example, it is possible to provide a plating laminate that prevents or reduces discoloration, wherein the plating turns a blackish brown color, and that has a high degree of reflection.

Accordingly, even when using silicone resin as a sealing resin, it is possible to maintain excellent reflecting characteristics in the plating layer provided on the lead frame in the sealing resin for a long time and to obtain excellent luminous efficiency.

DESCRIPTION OF EMBODIMENTS

The following describes Embodiments of the present invention with reference to the Figures.
[Embodiments 1 and 2]

Figure 1A:
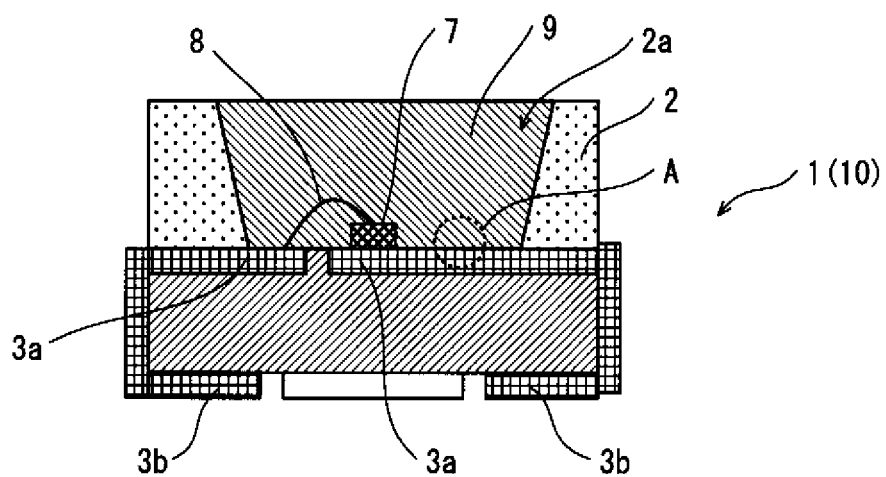
FIGS. 1A and 1B show a structure of a package for an optical semiconductor device and an optical semiconductor device using the package according to Embodiment 1.
Figure 2A:
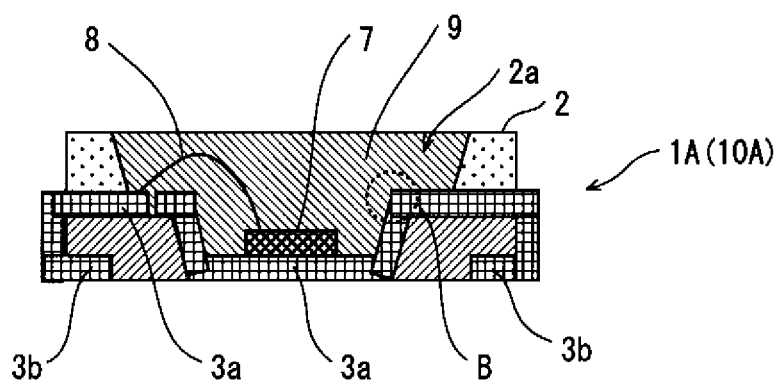
FIGS. 2A and 2B show a structure of a package for an optical semiconductor device and an optical semiconductor device using the package according to Embodiment 2.

FIGS. 1A and 2A are cross-section diagrams showing structures, according to the present invention, of a package for semiconductor devices 1 and 1A formed from resin and semiconductor devices 10 and 10A respectively using the packages.

Figure 1B:
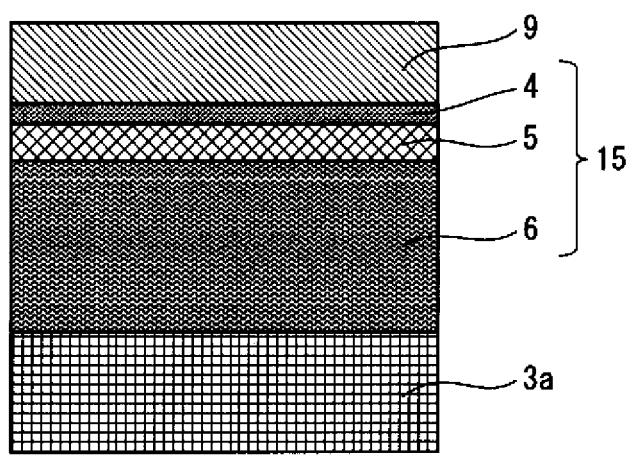
Figure 2B:
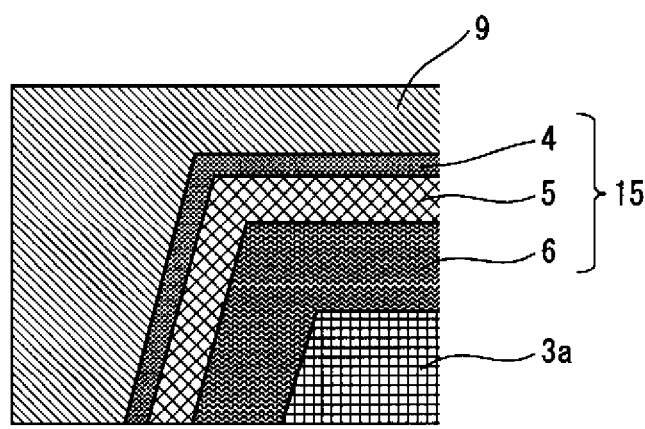

FIG. 1B is an enlarged cross-section diagram of part A of FIG. 1A, and FIG. 2B is an enlarged cross-section diagram of part B of FIG. 2A.

In both of the semiconductor devices 10 and 10A shown in FIGS. 1 and 2, a light emitting element 7 is mounted on a surface of one lead electrode 3a, and the light emitting element 7 is bonded to another lead electrode 3a via a bonding wire 8. In this condition, a space of a mortar-shaped resin enclosure 2, which is placed to surround the light emitting element 7, is filled with sealing resin 9.

Specifically, in the packages for a semiconductor device 1, 1A, the resin enclosures 2 form a one-piece molding for a lead frame (not shown in the Figures) via a method such as injection molding. A concavity 2a is formed on the side of the resin enclosure 2 that emits light (the side on which the light emitting element 7 is mounted), and as a whole the package is in the shape of a mortar. On the bottom surface of the concavity 2a, at least a pair of lead electrodes 3a is exposed. The metal components forming the lead electrodes 3a traverse the resin enclosure 2, and terminal electrodes 3b are formed where these metal components are exposed to the outside. The main difference between Embodiments 1 and 2 is the structure of the lead electrodes 3a and the terminal electrodes 3b.

A plating laminate 15, formed by a plurality of plating layers, is provided at least on the surface of the lead electrodes 3a and the terminal electrodes 3b which are exposed in the resin enclosure 2 (FIGS. 1B, 2B).

Preferably, the plating laminate 15 is composed of a pure Ag plating layer 6, a resistant plating layer 5, and a pure Ag flash plating layer (reflective plating layer 4) layered in sequence on the lead electrode 3a. The total thickness of the plating laminate 15 is approximately 2.657 μm, which is the total of the preferred thickness of each plating layer as shown below.

The reflective plating layer 4 is a thin layer composed of pure Ag material. An appropriate thickness of the reflective plating layer 4 is between 0.003 μm and 0.010 μm inclusive, with a preferred thickness of 0.007 μm.

The pure Ag plating layer 6 is provided to successfully connect the light emitting element 7 and the lead electrode 3a via a bonding wire 8 for electrical connection. An appropriate thickness of the pure Ag plating layer 6 is between 1.6 μm and 8.0 μm inclusive. A preferred thickness is 2.5 μm. An appropriate degree of brilliance is 1.2 or greater.

The resistant plating layer 5 is a plating layer that has chemical resistance to at least one of metal chlorides and metal sulfides and is composed of Au—Ag alloy plating. The resistant plating layer 5 is included in the plating laminate 15 as an intermediate layer. An appropriate thickness of the resistant plating layer 5 is thicker than the reflective plating layer 4: between 0.05 μm and 0.3 μm inclusive. A preferred thickness is 0.15 μm.

In this Embodiment, the resistant plating layer 5 is composed of a complete solid solution of an Au—Ag alloy. The Au—Ag alloy plating layer composing the resistant plating layer 5 has Au as a primary component and includes Ag in a range of 27.0 wt % to 50.0 wt % inclusive.

Individually plating each plating layer 4, 5, and 6 in order is one method of manufacturing the plating laminate. In other words, the pure Ag plating layer 6 is first formed on the surface of the lead electrode 3a (first plating step). Next, the Au—Ag alloy plating layer 5 is formed, as an intermediate layer of the plating laminate 15, on the surface of the pure Ag plating layer 6 (second plating step). Thereafter, the pure Ag flash plating layer 4 is formed as the uppermost layer of the plating laminate 15 (third plating step).

Immediately after the third plating step, the Au—Ag alloy plating layer is deposited in a state where Au atoms and Ag atoms are mixed but do not form a complete solid solution. In this state, the Ag atoms in the plating easily react with a halogen gas, and thus the plating needs to be processed to have superior corrosion resistance. Therefore, immediately after the third plating step, the Au—Ag alloy plating layer is provided with a heat history by being heated at a range of 300° C.-360° C. under a normal atmosphere (air), an atmosphere of nitrogen, or a green gas atmosphere before actual use of the optical semiconductor device or before performing a reliability test (heating step). Due to the characteristics of the assembly process of optical semiconductors, the heating atmosphere for the heat history is preferably an atmosphere of nitrogen or a green gas atmosphere. Heating time should be in a range of 20-80 seconds. By thus being heated, the Au—Ag alloy plating layer forms as a complete solid solution, yielding the resistant plating layer 5.

The resin enclosure 2 has a cross-sectional shape of a highly light-reflective mortar and is formed, for example, by injection molding of a thermoplastic polymer resin that includes highly light-reflective titanium oxide.

The sealing resin 9 is composed of a resin material with excellent heat resistance and transparency. In the optical semiconductor devices 10 and 10A, the light emitting element 7 and the surrounding area are sealed, with the light emitting element 7 being electrically connected to one of the lead electrodes 3a and connected to the other lead electrode 3a via the bonding wire 8, in order to prevent deterioration of the light emitting element or surrounding area due to heat, humidity, oxidation, etc. To match the light-emitting characteristics of the light emitting element 7, silicone resin material that is suited to light emission at a relatively short wavelength is used as the material for the sealing resin 9. Note that the silicone resin material is the primary component of the sealing resin 9, yet when using this resin material, metal sulfide or platinic chloride is included at an impurity level as an indispensible hardening catalyst.

In the optical semiconductor devices 1 and 1A of Embodiments 1 and 2 with the above structure, since a resistant plating layer 5 is included in the plating laminate 15 as an intermediate layer, even if a resin hardening catalyst such as metal sulfide or platinic chloride is included in the silicone resin material of which the sealing resin 9 is composed, the reflective plating layer 4, i.e. the uppermost layer of the plating laminate 15, is prevented from turning a blackish brown color, which has the advantageous effect of maintaining an excellent degree of reflection. Therefore, as compared to when the pure Ag plating layer 6 on the surface of the lead electrodes 3a is in direct contact with the silicone resin material, the plating formed on the lead electrodes 3a as per the above structure have remarkably improved characteristics, such as corrosion resistance, chloride resistance, sulfur resistance, oxidation resistance, etc.

Accordingly, the optical semiconductor devices 1 and 1A have a better initial degree of reflection than the plating laminate that the present inventors previously invented, as recited in Patent Literature 2. Furthermore, an initial degree of reflection that is comparable to a pure Ag plating layer is obtained in the optical semiconductor devices 1 and 1A.

Figure 4:
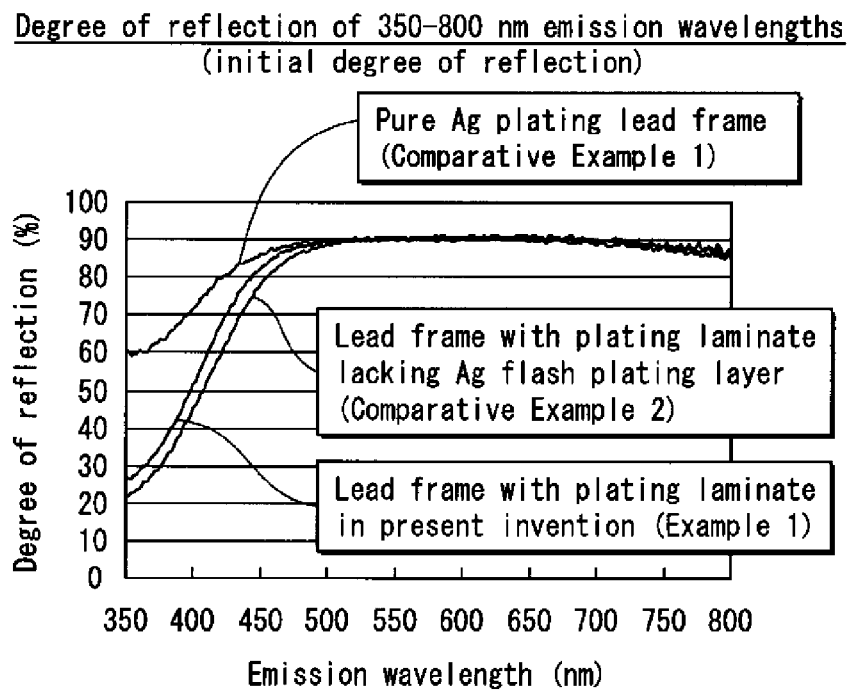
FIG. 4 is a graph showing an initial degree of reflection (emission wavelength of 350-800 nm) of optical semiconductor devices.
Figure 5:
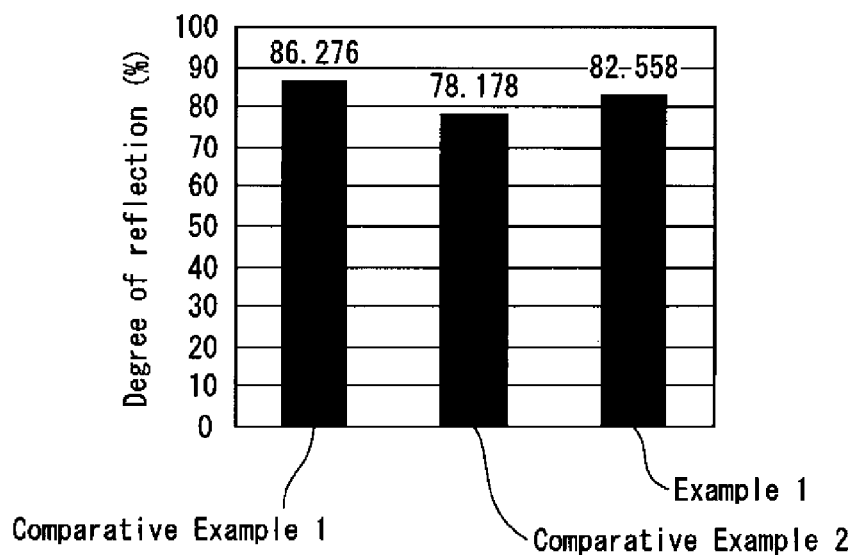
FIG. 5 is a graph showing an initial degree of reflection (emission wavelength of 450 nm) of optical semiconductor devices.

FIGS. 4 and 5 show the degree of reflection over certain emission wavelengths of optical semiconductor devices in an initial state after manufacturing. Example 1 represents a lead frame formed with the plating laminate in Embodiment 1. Comparative Example 1 represents a lead frame formed with only a pure Ag plating layer. Comparative Example 2 represents a lead frame formed with a plating laminate (having an Au—Ag alloy layer as the uppermost layer) from which Ag flash plating is omitted.

As shown in FIGS. 4 and 5, in the emission wavelength range of 350-800 nm, Example 1 has a better initial degree of reflection than the plating laminate (Comparative Example 2) that the present inventors previously invented, as recited in Patent Literature 2. Also, Example 1 has a comparable initial degree of reflection to Comparative Example 1, which is formed only with pure Ag plating.

Table 1 below shows the results obtained by verifying discoloration of the plating layer when the devices were driven with a current of 15 mA for 1,000 hours at an environmental temperature of 85° C.

TABLE 1

Comparison of High-Temperature Current Test

| Plating Structure | Temp. | Current | Time | Discoloration to blackish brown color? |
|---|---|---|---|---|
| Pure Ag plating only (Comparative Example 1) | 85° C. | 15 mA | 1,000 H | Discoloration observed |
| Plating laminate | | | | No discoloration |

Test performed on package for optical semiconductor device in Embodiment 1

As shown in Table 1, the Ag plating layer in the package for an optical semiconductor device in Comparative Example 1 turned a blackish brown color, whereas the package for an optical semiconductor device in Example 1 did not turn a blackish brown color. These results demonstrate that, as compared to Comparative Example 1 in which the pure Ag plating layer comes into direct contact with the silicone resin, the plating of Example 1 has improved corrosion resistance, chloride resistance, sulfur resistance, and oxidation resistance, and therefore can maintain an excellent degree of reflection.

Next, an accelerated sulfidation test was performed to verify the characteristics of reflection efficiency and corrosion resistance resulting in the present invention and to verify how these characteristics can coexist.

Example 1 and Comparative Examples 1 and 2 were used as test samples.

For the accelerated sulfidation test, the lead frame in each sample was pretreated via heating for one minute at 350° C. This setting for the heating is based on the heat history during the assembly process of the optical semiconductor device.

Next, based on the Japanese Industrial Standard (JIS) H8621 method of testing resistance to discoloration, an ammonium sulfide solution (0.2 ml/L aqueous ammonium sulfide solution) was created. Each sample, with the above-described heat history added to the lead frame, was immersed in this solution for five minutes while exposed to ultrasonic waves, after which each sample was thoroughly washed in water and dried.

Figure 6:
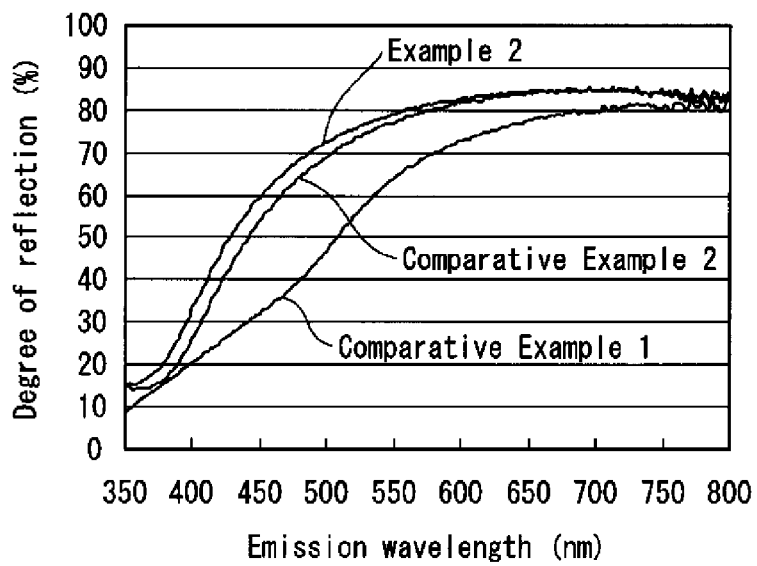
FIG. 6 is a graph showing a degree of reflection (emission wavelength of 350-800 nm) of optical semiconductor devices after a sulfidation test.
Figure 7:
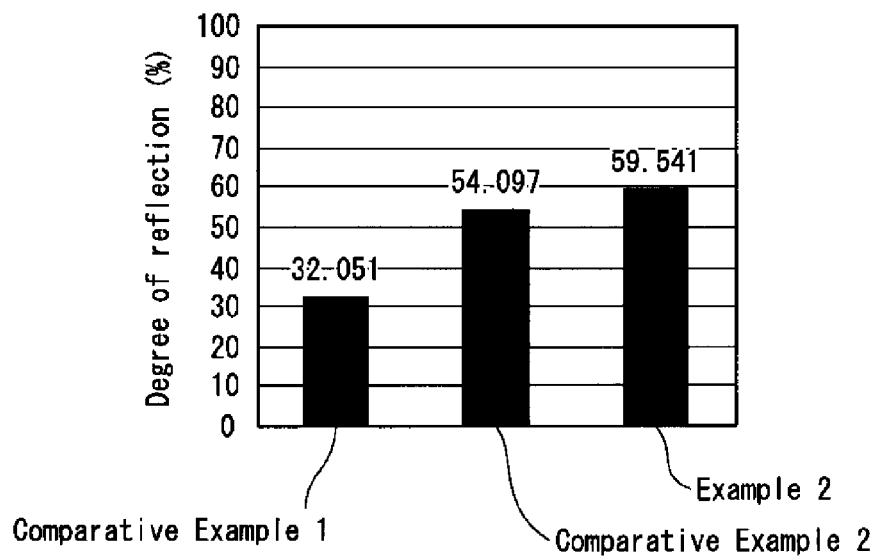
FIG. 7 is a graph showing a degree of reflection (emission wavelength of 450 nm) of optical semiconductor devices after a sulfidation test.

FIGS. 6 and 7 show the results of measurement of the subsequent degree of reflection over an emission wavelength range of 350-800 nm.

As shown in each of these Figures, the degree of reflection of the Ag plating (Comparative Example 1) decreases remarkably due to sulfidation. On the other hand, it is clear that in the plating laminate in the present invention (Example 1) and in Comparative Example 2, regardless of the presence of an Ag flash plating layer 4, the degree of reflection does not decrease from the initial degree of reflection shown in FIGS. 4 and 5, and that sulfidation is prevented.

Comparing Example 1 and Comparative Example 2 reveals that Example 1, which has an Ag flash plating layer 4 layered thereon, maintains a slightly higher degree of reflection than Comparative Example 2. This indicates that, by heating for one minute at 350° C. as pretreatment, the Au—Ag alloy plating layer becomes a complete solid solution and, simultaneously, the thin Ag flash plating layer 4 causes metallic diffusion in the complete solid solution layer, thereby forming a more stable complete solid solution.

[Embodiment 3]

The following is a description of Embodiment 3, focusing on the differences with Embodiments 1 and 2.

Figure 3A:
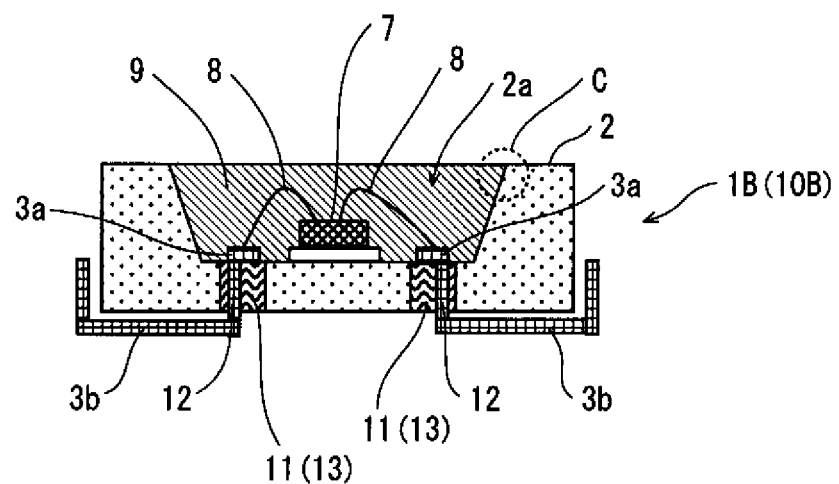
FIGS. 3A and 3B show a structure of a package for an optical semiconductor device and an optical semiconductor device using the package according to Embodiment 3.
Figure 3B:
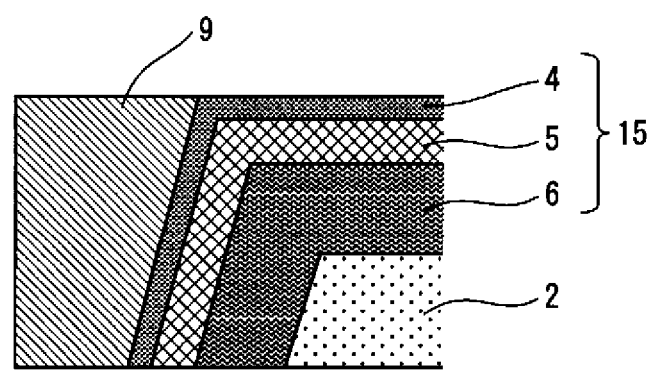

FIGS. 3A and 3B show a structure of a package for an optical semiconductor device 1B and an optical semiconductor device using 10B the package according to Embodiment 3.

The optical semiconductor device 10B shown in FIGS. 3A and 3B is formed with a package for a semiconductor device that is hermetically sealed. In the sealing resin 9, which is composed of silicone resin that includes a hardening catalyst of platinic chloride at an impurity level, a plating laminate 15 is provided on the surface of the lead electrodes 3a, the plating laminate 15 including a pure Ag plating layer 6, a pure Ag flash plating layer 4 as an uppermost layer, and an Au—Ag alloy plating layer 5 as an intermediate layer between the pure Ag plating layer 6 and the uppermost layer.

Specifically, the package for a semiconductor device 1B comprises a metallic package 2 made of Cu or having Cu as the primary component. A concavity 2a is formed on the main surface, i.e. the side from which light is emitted, of the metallic enclosure 2. At the bottom surface of the concavity 2a, through-holes 11 are formed along the direction of thickness of the package (the vertical direction in the figure). Lead wires 12 are inserted in the through-holes 11, and the through-holes 11 are sealed by insulating glass 13. The lead wires 12 are bent to be parallel to the bottom surface of the concavity 2a, and lead electrodes 3a are exposed. The lead electrodes 3a are bent to be parallel to the bottom surface of the metallic enclosure 2 and are exposed, at which point terminal electrodes 3b are formed.

A plating laminate 15 is provided at least on the surface area where the lead electrodes 3a and terminal electrodes 3b are exposed in the metallic enclosure 2. Similar to Embodiments 1 and 2, the plating laminate 15 has a layered structure, including a pure Ag plating layer 6, resistant plating layer 5, and pure Ag flash plating layer 4. The thickness and the structure of the plating laminate 15 are similar to Embodiments 1 and 2.

Note that, while not shown in the Figures, an insulating layer is located between the metallic enclosure 2 and the lead electrodes 3a. Also, as shown in FIG. 3B, the plating laminate 15 is also formed on the surface of the concavity 2a. In other words, in Embodiment 3, the plating laminate 15 is provided on at least part of the surface (in this case, roughly the entire surface) of the concavity 2a in the metallic enclosure 2, the surface being in contact with the sealing resin 9. Embodiment 3 is thus devised to further improve the visible light yielded when driving the optical semiconductor device, thereby further increasing luminance.

With the above structure according to Embodiment 3, the package for an optical semiconductor device 1B and an optical semiconductor device 10B using the package achieve nearly the same advantageous effect as in Embodiments 1 and 2 of maintaining an excellent degree of reflection of the plating layer formed above the lead electrodes 3a for a long time.

Additionally, due to the plating laminate 15 formed on the concavity 2a, which forms a broad area of the reflective surface of the metallic enclosure 2, an excellent degree of reflection of visible light is maintained. The package for an optical semiconductor device 1B and the optical semiconductor device 10B using the package thus result in improved luminance.

FIGS. 6 and 7 show the results of the same experiment as performed on Example 1 and Comparative Examples 1 and 2, this time preparing the package for an optical semiconductor device in Embodiment 3 as Example 2.

As shown in FIGS. 6 and 7, for Embodiment 3, a reflection efficiency comparable to a structure using only an Ag plating layer (Comparative Example 1) was obtained.

Furthermore, as shown in Table 2, as compared to when the pure Ag plating layer 6 comes into direct contact with the silicone resin, the plating at the lead electrodes 3a has remarkably improved corrosion resistance, chloride resistance, sulfur resistance, and oxidation resistance.

TABLE 2

Comparison of High-Temperature Current Test

| Plating Structure | Temp. | Current | Time | Discoloration to blackish brown color? |
|---|---|---|---|---|
| Pure Ag plating only (Comparative Example 1) | 85° C. | 450 mA | 1,000 H | Discoloration observed |
| Plating laminate | | | | No discoloration |

The results of creative research by the inventors reveal that, for all of the Embodiments, a comparison of corrosion resistance when a reflective plating layer 4 with a thickness between 0.003 μm and 0.010 μm inclusive is provided in the plating laminate 15 and when no such reflective plating layer is provided (i.e. the structures in Comparative Examples 1 and 2 with either only a pure Ag plating layer or with the addition of a resistant plating layer) indicates that the plating laminate 15 (Examples 1 and 2), in which a pure Ag flash plating layer is provided, has superior characteristics with regards to both the amount of discoloration and the degree of reflection.

Specifically, the results of FIGS. 4, 5, 6, and 7 demonstrate that by adopting the plating laminate 15 in the present invention, the degree of reflection of the lead electrodes with respect to emissions by the light emitting element increases to 50% or greater at a wavelength of 400 nm, to 80% or greater at a wavelength of 450 nm, and to 85% or greater at an emission wavelength range of 500 nm to 700 nm.

[Industrial Applicability]

The present invention can be used as an optical semiconductor device for illumination or in vehicles, for example. In these cases, the present invention offers superb advantageous effects as technology for improving emission of white light of a light source.

[Reference Signs List]

1, 1A, 1B package for semiconductor device
2 enclosure
2a concavity
3a lead electrode
3b terminal electrode
4 reflective plating layer
5 resistant plating layer
6 plating layer
7 light emitting element
8 bonding wire
9 sealing resin
10, 10A, 10B optical semiconductor device
11 through-hole
12 lead wire
13 insulating glass
15 plating laminate

The invention claimed is:

1. An optical semiconductor device comprising a light emitting element, provided in electrical connection with a lead electrode, and sealing resin provided so as to seal the light emitting element and the lead electrode, wherein:
a plating laminate composed of a plurality of plating layers is formed on at least part of a surface of the lead electrode,
the plating laminate includes:
a pure Ag plating layer;
an uppermost layer that is a thin film reflective plating layer thinner than the pure Ag plating layer; and
an intermediate layer, between the pure Ag plating layer and the uppermost layer, that is a resistant plating layer composed of a complete solid solution Au—Ag alloy plating layer, the resistant plating layer having chemical resistance to at least one of metal chlorides and metal sulfides,
the lead electrode has a degree of reflection, with respect to emissions by the light emitting element, of 50% or greater at an emission wavelength of 400 nm, 80% or greater at an emission wavelength of 450 nm, and 85% or greater at an emission wavelength range of 500 nm to 700 nm, and
the reflective plating layer is a thin layer of pure Ag.

2. The optical semiconductor device of claim 1, wherein the Au—Ag alloy plating includes Au as a primary component and includes Ag in a range of 27.0 wt % to 50.0 wt % inclusive.

3. The optical semiconductor device of claim 1, wherein the resistant plating layer has a thickness between 0.05 μm and 0.3 μm inclusive.

4. The optical semiconductor device of claim 1, wherein the reflective plating layer has a thickness between 0.003 μm and 0.010 μm inclusive.

5. The optical semiconductor device of claim 1, wherein the pure Ag plating layer has a thickness between 1.6 μm and 8.0 μm inclusive.

6. The optical semiconductor device of claim 1, wherein the pure Ag plating layer has a degree of brilliance of 1.2 or greater.

7. The optical semiconductor device of claim 1, wherein the plating laminate is provided at, at least, part of a surface of an enclosure that is in contact with sealing resin.

8. The optical semiconductor device of claim 1, wherein the sealing resin is a transparent resin that includes a metal chloride catalyst.

9. The optical semiconductor device of claim 8, wherein the transparent resin is silicone resin.

10. The optical semiconductor device of claim 8, wherein the metal chloride catalyst is platonic chloride.

11. The optical semiconductor device of claim 1, wherein the plating laminate has a total thickness of approximately 2.657 μm.

12. The optical semiconductor device of claim 1, wherein the sealing resin includes at least one of a metal chloride and a metal sulfide.

* * * * *